United States Patent [19]

Youngbluth, Jr.

[11] 4,130,795
[45] Dec. 19, 1978

[54] VERSATILE LDV BURST SIMULATOR

[75] Inventor: Otto Youngbluth, Jr., Yorktown, Va.

[73] Assignee: The United States of America as represented by the Administrator of the National Aeronautics and Space Administration, Washington, D.C.

[21] Appl. No.: 861,396

[22] Filed: Dec. 16, 1977

[51] Int. Cl.² ............................................. G01R 27/00
[52] U.S. Cl. ................................................ 324/57 R
[58] Field of Search ............. 324/57 R, 57 DE, 57 H; 328/63, 223, 116; 331/75

[56] References Cited

U.S. PATENT DOCUMENTS

| | | | |
|---|---|---|---|
| 3,573,634 | 4/1971 | Rachel | 328/63 |
| 3,593,169 | 7/1971 | Markow | 328/223 |
| 3,629,696 | 12/1971 | Bartlink | 324/57 R |
| 3,873,937 | 3/1975 | Lindstrum | 331/75 |

*Primary Examiner*—Stanley T. Krawczewicz

*Attorney, Agent, or Firm*—William H. King; Howard J. Osborn; John R. Manning

[57] ABSTRACT

A device for generating burst signals that can be used to determine whether or not a laser doppler velocimeter is operating properly. A high frequency signal which corresponds to the information frequency of the laser doppler velocimeter is modulated by a low frequency signal to provide an envelope for the high frequency signal. The high frequency signal is modulated by the low frequency signal by any modulator means such as, for example, an analog multiplier. The low frequency signal is added to the modulated signal to provide pedestals for the resulting series of burst pulses. Then means are provided for selecting different combinations of these burst signals. Also means are provided for making the burst signals asymmetrical as desired. In addition, means are provided for varying the frequencies and amplitudes of the information, envelope and pedestal frequency signals in the burst signals.

10 Claims, 3 Drawing Figures

VERSATILE LDV BURST SIMULATOR

ORIGIN OF THE INVENTION

The invention described herein was made by an employee of the United States Government and may be manufactured and used by or for the Government for governmental purposes without the payment of any royalties thereon or therefore.

BACKGROUND OF THE INVENTION

The invention relates generally to signal generators and more specifically concerns a laser doppler velocimeter (LDV) burst simulator for generating burst signals that can be used to determine whether or not an LDV is functioning properly.

In the prior art LDV burst simulators the information frequency is a fixed multiple of the pedestal frequency. Hence, these frequencies cannot be independently varied. Also, the prior art LDV burst simulators do not provide means for making the burst signals asymmetric and means for generating selected combinations of the burst signals.

It is an object of this invention to provide a device for generating burst signals suitable for determining whether or not an LDV is functioning properly.

Another object of this invention is to provide an LDV burst simulator in which the information, envelope and pedestal frequencies in the generated burst signals can be independently varied.

A further object of this invention is to provide an LDV burst simulator in which the amplitudes of the information frequency, envelope frequency and pedestal frequency signals in the generated burst signals can be independently varied.

Still another object of this invention is to provide an LDV burst simulator that will generate single, multiple, or continuous burst signals.

A still further object of this invention is to provide an LDV burst simulator which allows for asymmetry in the generated burst signals.

An additional object of this invention is to provide an LDV burst simulator that has an accurate and easy readout of both the information and envelope frequencies.

Other objects and advantages of this invention will become apparent hereinafter in the specification and drawings.

SUMMARY OF THE INVENTION

The invention is an LDV burst simulator which generates burst signals that are suitable for testing an LDV. The signal from a source having a frequency corresponding to the information frequency of the LDV is multiplied by a signal from a source having a frequency corresponding to the envelope and pedestal frequencies of the LDV. The resulting signal is added to the pedestal frequency signal to produce a series of burst signals having the information frequency of the LDV and having an envelope and pedestals with a frequency equal to the envelope frequency of the LDV. Means are included for independently varying the frequencies and amplitudes of the information and envelope frequency signals. Means are provided for selecting from the series of the burst signals either single, multiple or continuous burst signals. Also, means are provided for making the burst signals asymmetric as desired. In addition, accurate and easy readout of both the information frequency and the envelope frequency is provided.

DETAILED DESCRIPTION OF THE INVENTION

Figure 1:
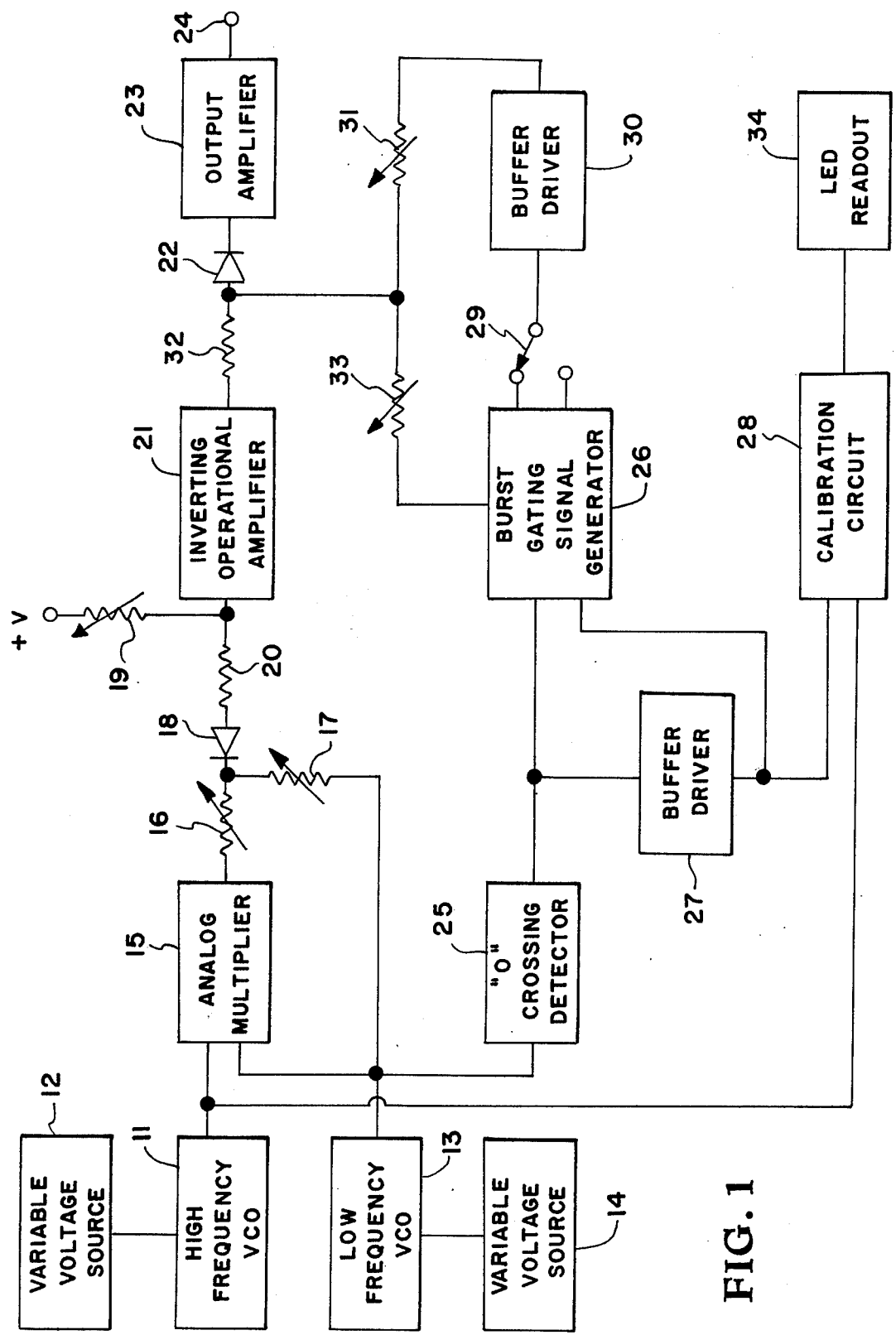
FIG. 1 is a block diagram of the embodiment of the invention selected for illustration in the drawings.

Turning now to the embodiment of the invention selected for illustration in the drawings the number 11 in FIG. 1 designates a high frequency voltage control oscillator (VCO) 11 which is used to generate a sine wave at the information frequency of the LDV to be tested. A variable voltage source 12 controls the frequency produced by the VCO 11. Inasmuch as the information frequency of many LDVs is in the 100 kHz to one MHz range, the range of the frequencies produced by VCO 11 is 100 kHz to one MHz. A low frequency VCO 13 controlled by a variable voltage source 14 produces sine wave frequencies in the range of from one kHz to 10 kHz. The signal produced by VCO 13 provides both the envelope and pedestal for the produced burst signals. The signals at the outputs of VCO 11 and VCO 13 are modulated by means of an analog multiplier 15. A balanced modulator could be used in place of analog multiplier 15. The output of multiplier 15 is a series of signals having an information frequency equal to the output frequency of VCO 11 and having an envelope frequency equal to the output frequency of VCO 13. The signal at the output of VCO 13 is added to the series of signals at the output of multiplier 15 by means of a variable resistor 16 and a variable resistor 17. The resulting summed signals at the junction of resistors 16 and 17 is a series of burst signals having an information frequency equal to the output frequency of VCO 11, and having an envelope and pedestal frequency equal to the output frequency of VCO 13. Only the negative portion of the burst signals of the series of burst signals are allowed to pass through a diode 18. A positive dc voltage (+V) is added to the burst signals passed through diode 18 by means of summing resistors 19 and 20. The resulting signals are then applied to an inverting operational amplifier 21. The output of inverting operational amplifier 21 is a series of upright burst pulses that are suppressed below ground because of the inversion of the +V offset voltage. Inasmuch as these burst signals are below ground they will not pass through a diode 22 and an output amplifier 23 to an output terminal 24.

The sine wave output of VCO 13 is applied to an "0" crossing detector 25. The output of detector 25 is a series of positive voltage levels that begin when the sine wave at the output of VCO 13 goes from negative to positive and end when the sine wave goes from positive to negative. The output of detector 25 is applied directly to a burst gate signal generator 26 and also through a buffer driver 27 to signal generator 26 and to a calibration circuit 28. Two of the outputs of burst gating generator 26 are connected to a switch 29. In the position of switch 29 as shown, a single pulse will pass through switch 29. In the other position of switch 29 a series of pulses having a frequency of 1/n times the frequency of the output of VCO 13 where n is equal to 1, 2, 3, . . . , is connected through the switch 29 to a buffer driver 30. The output of buffer driver 30 is a series of pulses which are applied through a summing resistor 31 to a summing point at the output of inverting operational amplifier 21. The output of amplifier 21 is applied through a summing resistor 32 to the summing point. The amplitudes of the positive pulses at the output of buffer driver 30 are equal to the magnitude of the positive dc voltage +V. Consequently, each time a pulse appears at the output of buffer driver 30 the suppressed burst signal at the output of amplifier 21 is raised to above ground level and will therefore pass through diode 22 and output amplifier 23 to the output terminal 24. Hence, the burst signals at the output of terminal 24 correspond to the pulses produced at the output buffer driver 30. In addition, burst gating signal generator 26 produces at its other output a series of asymmetric pulses which can be applied through a summing resistor 33 to the output of amplifier 21 to produce asymmetric burst pulses at the output terminal 24. The details of burst gating signal generator 26 are disclosed in FIG. 2. Calibration circuit 28 which receives its inputs from detector 25 and VCO 11 measures the information and envelope frequencies by means of a LED readout 34 and also calibrates these frequency readouts by means of a known frequency source. The details of calibration circuit 34 are shown in FIG. 3.

Figure 2:
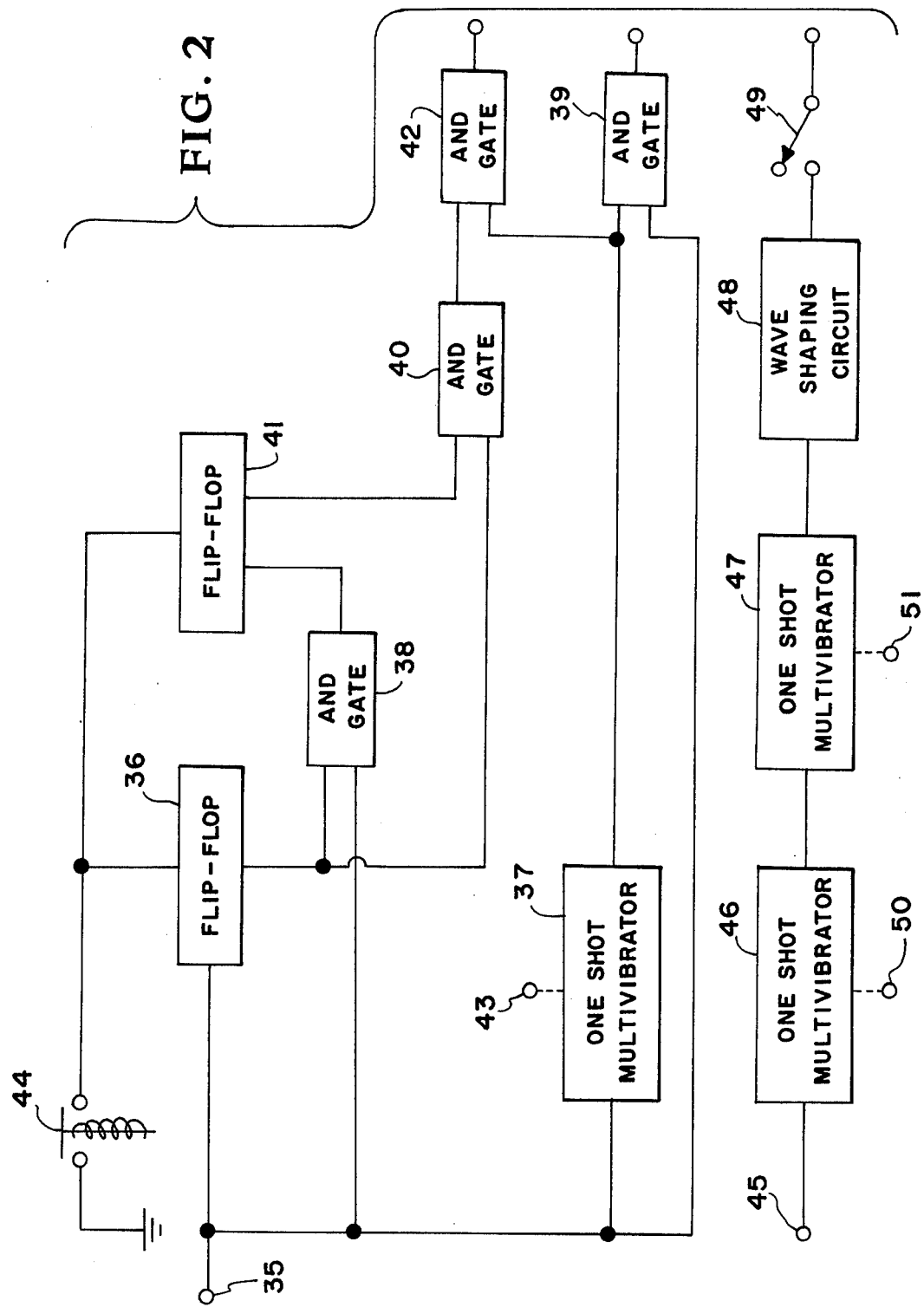
FIG. 2 is a block diagram of the burst gating signal generator shown in FIG. 1.
Figure 3:
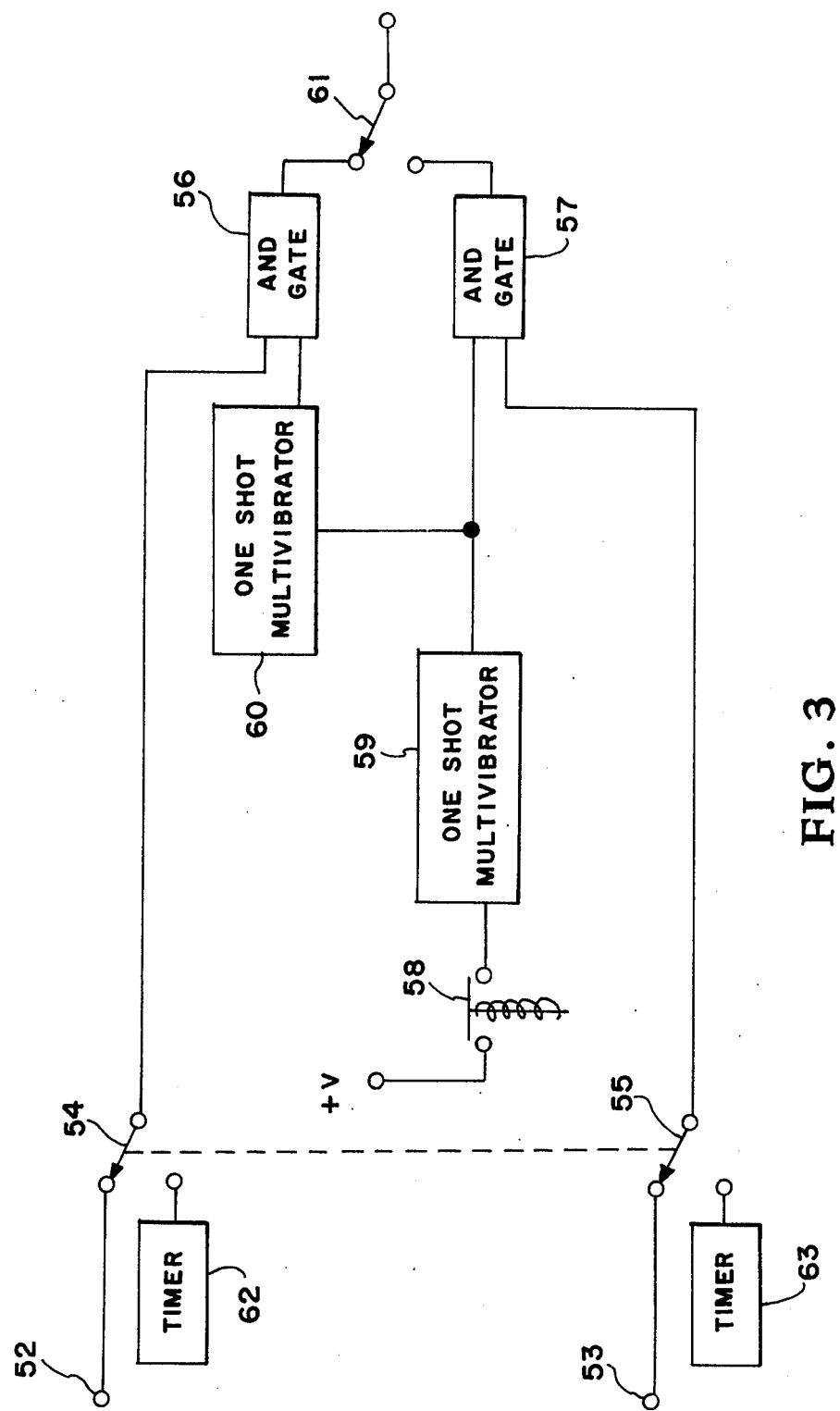
FIG. 3 is a block diagram of the calibration circuit shown in FIG. 1.

The burst gating signal generator 26 in FIG. 1 as shown in FIG. 2 includes a terminal 35 that is connected directly to detector 25. The positive voltage levels applied to terminal 35 are applied to the clock input of a flip flop 36, to a one-shot multivibrator 37 and to AND gates 38 and 39. The Q output of flip flop 36 is connected to AND gate 38 and to AND gate 40. The output of AND gate 38 is connected to the clock input of a flip flop 41 whose Q output is connected to AND gate 40. The output of AND gate 40 is connected to AND gate 42 and the output of one-shot multivibrator 37 is connected to AND gates 39 and 42. One-shot multivibrator 37 includes a knob 43 for changing the time constant of the multivibrator thereby changing the duration of the pulses generated by the multivibrator. A spring loaded debounced switch 44 connects the preset input of flip flop 36 and the clear input of flip flop 41 to ground such that each time switch 44 is depressed the Q output of flip flop 36 is preset to a binary "1" and the Q output of flip flop 41 is set to a binary "0." Flip flop 36 is triggered on the leading edges of the positive voltage levels at the output of detector 25, flip flop 41 is triggered on the leading edges of the positive voltage levels produced at the output of AND gate 38, and one-shot multivibrator 37 is triggered on the trailing edges of the positive voltage levels at the output of detector 25.

With the above described circuitry each time switch 44 is depressed one pulse only appears at the output of AND gate 42. Also, depending upon the setting of knob 43, every time, every other time, every third time, etc. a pulse or a voltage level is generated by detector 25, a pulse is generated at the output of AND gate 39. That is, pulses are generated at the output of AND gate 39 that have a frequency of 1/n times the frequency of the output of VCO 13 where n is equal to 1, 2, 3, . . . . Multivibrator 37 produces a Not pulse which blocks AND gate 39. Hence, after a positive voltage level is passed through AND gate 39 any number of the following positive voltage levels, depending on the setting of knob 43, can be blocked by multivibrator 37.

The output of buffer driver 27 is applied through a terminal 46 to a one-shot multivibrator 46. The pulse generated by multivibrator 46 is applied to a one-shot multivibrator 47 the output of which is shaped by a wave shaping circuit 48 and applied to a switch 49. The output of switch 49 is applied through summing resistor 33 to the summing point at the output of inverting operational amplifier 21. Multivibrator 46 includes a knob 50 for changing the time constant of the multivibrator so as to vary the duration of the pulse produced by multivibrator 46 and hence the time at which the output of the wave shaping circuit 48 occurs. Consequently, knob 50 can be adjusted to synchronize the shape of the wave at the output of wave shaping circuit 48 with the burst signals at the output of inverting operational amplifier 21. Multivibrator 47 includes a knob 51 for changing the time constant of the multivibrator so as to vary the duration of its output pulse and the duration of the output of wave shaping circuit 48. With the aid of switch 29 and knob 43 the burst gating signal generator can be used to select either one burst signal or 1/n times the frequency of VCO 13 burst signals where n is equal to 1, 2, 3, . . . . With the aid of switch 49 the asymmetric voltage wave at the output of wave shaping circuit 48 can be added to the selected burst signals.

The calibration circuit 28 as shown in FIG. 3 includes terminals 52 and 53 which are connected to buffer driver 27 and to the output of high frequency VCO 11, respectively. Terminal 52 is connected through a switch 54 to AND gate 56 and terminal 53 is connected through a switch 55 to AND gate 57. Switches 54 and 55 are mechanically connected together so that they operate in unison. A spring loaded debounced switch 58 connects a +V voltage to a one-shot multivibrator 59 such that it generates a pulse each time that switch 58 is depressed. The output of multivibrator 59 is connected to AND gate 57 and to one-shot multivibrator 60 which generates a pulse that is applied to AND gate 56. The outputs of AND gate 56 and 57 are connected through a switch 61 to the LED readout 34. With switches 54, 55, and 61 positioned as shown, the voltage levels from detector 25 passes through AND gate 56 for the duration of the pulse generated by one-shot multivibrator 60 and these voltage levels are counted by the LED readout 34. If the position of switch 61 is changed the frequency from the high frequency VCO 11 is passed through AND gate 57 for a time determined by the duration of the pulse generated by the one-shot multivibrator 59 and counted by LED readout 34. The reason for having the two multivibrators 59 and 60 is so that the duration of the pulse generated by the multivibrator 57 can be made much shorter than the duration of the multivibrator 60 and conserve the stages of the readout that have to be provided by the readout 34. Timers 62 and 63, which are known frequency sources, are provided for calibrating the duration of the pulses generated by multivibrators 59 and 60, respectively.

All of the elements disclosed in FIGS. 1, 2, and 3 are well known and commercially available and hence are not disclosed in detail in this specification.

The advantages of this invention are that it provides a versatile LDV burst simulator. It can vary the information, pedestal and envelope frequencies, it can vary the amplitudes of the information frequency signals, envelope signals, and the pedestal signals, it can select many different combinations of the burst signals, and it can make the burst signals asymmetric.

What is claimed is:

1. A laser doppler velocimeter burst simulator for producing known signals that can be used to determine if a LDV is functioning properly comprising:
   means for producing a signal having a frequency equal to the information frequency of said LDV;
   means for producing a signal having a frequency equal to the pedestal and envelope frequencies of said LDV;
   a modulator means for modulating said information and envelope frequency signals to produce a series of signals with the envelope frequency forming the envelope for the series of signals and with the information frequency signal being the information frequency for the series of signals;
   means for adding said envelope frequency signal to said series of signals at the output of said modulating means to form a series of burst signals; and
   means for selecting different combinations of the burst signals from said series of burst signals for application to said LDV to determine if it is functioning properly.

2. An LDV burst simulator according to claim 1 including means for separately varying the frequencies produced by said information and said envelope frequency signal producing means.

3. An LDV burst simulator according to claim 1 including means for separately varying the amplitudes of the envelope frequency signals and the series of signals at the output of said modulating means before they are summed by said adding means.

4. An LDV burst simulator according to claim 1 wherein said modulating means is an analog multiplier.

5. An LDV burst simulator according to claim 1 wherein said means for selecting different combinations of the burst signals includes means for selecting single, multiple, or continuous burst signals.

6. An LDV burst simulator according to claim 1 wherein said means for selecting different combinations of the burst signals includes means for making the burst signals asymmetric.

7. An LDV burst simulator according to claim 1 wherein said means for selecting different combinations of the burst signals comprises:
   diode means for selecting only the negative portions of said series burst signals;
   means for adding a positive dc voltage to said negative selected portions;
   means for inverting the last mentioned added voltages;
   means for added selected positive pulses to said inverted voltages whereby only the burst signals occurring during these pulses will be positive; and
   diode means for selecting only the resulting positive burst signals.

8. An LDV burst simulator according to claim 7 wherein said means for adding selected positive pulses includes an "0" crossing detector receiving said envelope frequency signal for producing signals beginning and ending whenever the envelope frequency signal changes polarity and means receiving these signals for generating said selected positive pulses whereby the selected positive pulses are in synchronism with said burst signals.

9. An LDV burst simulator according to claim 8 including means receiving said signals produced by said "0" crossing detector for producing asymmetric positive pulses which make the burst signals asymmetric.

10. An LDV burst simulator according to claim 1 wherein calibration means are provided for measuring the frequencies of the information and envelope frequency signals and for calibrating said measuring means.

* * * * *